(12) United States Patent
Wu et al.

(10) Patent No.: US 12,556,162 B2
(45) Date of Patent: Feb. 17, 2026

(54) TUNING MULTIPLEXER FILTERS

(71) Applicant: Skyworks Solutions, Inc., Irvine, CA (US)

(72) Inventors: Nan Wu, Irvine, CA (US); Yiliu Wang, Irvine, CA (US); Stephane Richard Marie Wloczysiak, Irvine, CA (US); Bo Yu, San Diego, CA (US)

(73) Assignee: Skyworks Solutions, Inc., Irvine, CA (US)

(*) Notice: Subject to any disclaimer, the term of this patent is extended or adjusted under 35 U.S.C. 154(b) by 547 days.

(21) Appl. No.: 18/068,325

(22) Filed: Dec. 19, 2022

(65) Prior Publication Data

US 2023/0216485 A1 Jul. 6, 2023

Related U.S. Application Data

(60) Provisional application No. 63/266,238, filed on Dec. 30, 2021.

(51) Int. Cl.
*H03H 9/70* (2006.01)
*H01Q 1/12* (2006.01)
*H03H 9/54* (2006.01)

(52) U.S. Cl.
CPC ............... *H03H 9/70* (2013.01); *H01Q 1/12* (2013.01); *H03H 9/542* (2013.01); *H03H 9/547* (2013.01)

(58) Field of Classification Search
CPC .......... H03H 9/70; H03H 9/542; H03H 9/547; H01Q 1/12
See application file for complete search history.

(56) References Cited

U.S. PATENT DOCUMENTS

| | | | |
|---|---|---|---|
| 10,447,322 B2 | 10/2019 | Wloczysiak | |
| 10,965,021 B2 | 3/2021 | Wloczysiak | |
| 11,356,128 B2 | 6/2022 | Wloczysiak | |
| 11,437,976 B2 | 9/2022 | Kaneda et al. | |
| 11,601,113 B2 | 3/2023 | Wang et al. | |
| 11,705,886 B2 | 7/2023 | Komatsu et al. | |
| 2003/0160664 A1* | 8/2003 | Beaudin | H03H 9/605 333/133 |
| 2004/0203703 A1* | 10/2004 | Fischer | H04W 88/085 455/560 |
| 2015/0038101 A1 | 2/2015 | Maxim et al. | |
| 2016/0119017 A1* | 4/2016 | Xu | H04B 1/18 455/79 |

(Continued)

FOREIGN PATENT DOCUMENTS

WO    WO 2023/129823    7/2023

OTHER PUBLICATIONS

International Search Report and Written Opinion in application no. PCT/US2022/081885, mailed on Apr. 14, 2023, in 7 pages.

*Primary Examiner* — Michael Thier
*Assistant Examiner* — Tracy Lauren Raimondo
(74) *Attorney, Agent, or Firm* — Knobbe, Martens, Olson & Bear, LLP

(57) ABSTRACT

Systems and methods for tuning multiplexer filters are disclosed. In one aspect, a multiplexer includes a first filter coupled to a common node, the first filter configured to pass a first band, a second filter coupled to the common node, the second filter configured to pass a second band, and at least one electrical component configured to generate a notch at a frequency between the first band and the second band.

21 Claims, 11 Drawing Sheets

(56) References Cited

U.S. PATENT DOCUMENTS

| | | | |
|---|---|---|---|
| 2018/0062682 A1 | 3/2018 | Wloczysiak et al. | |
| 2018/0063031 A1 | 3/2018 | Wloczysiak et al. | |
| 2018/0123619 A1* | 5/2018 | Bradley | H04L 5/14 |
| 2018/0192320 A1 | 7/2018 | Khlat et al. | |
| 2018/0226945 A1* | 8/2018 | Kim | H03H 9/1014 |
| 2019/0097661 A1 | 3/2019 | Chang et al. | |
| 2019/0181890 A1 | 6/2019 | Schmidhammer et al. | |
| 2019/0181907 A1* | 6/2019 | Pfann | H03H 9/52 |
| 2019/0334563 A1* | 10/2019 | Elbrecht | H04B 1/0057 |
| 2020/0412320 A1* | 12/2020 | Reid | H03H 7/06 |
| 2021/0028765 A1 | 1/2021 | Wang et al. | |
| 2021/0067139 A1 | 3/2021 | Komatsu et al. | |
| 2021/0105005 A1 | 4/2021 | Kankar et al. | |
| 2021/0126619 A1 | 4/2021 | Wang et al. | |
| 2022/0182084 A1 | 6/2022 | King et al. | |
| 2022/0200572 A1 | 6/2022 | Wang et al. | |
| 2022/0209743 A1 | 6/2022 | Liu et al. | |
| 2022/0209747 A1 | 6/2022 | Wang et al. | |
| 2022/0263495 A1 | 8/2022 | Wang et al. | |
| 2022/0294423 A1 | 9/2022 | Wang et al. | |
| 2022/0321101 A1 | 10/2022 | Liu et al. | |
| 2023/0010291 A1 | 1/2023 | Komatsu et al. | |
| 2023/0046261 A1 | 2/2023 | Yu et al. | |
| 2023/0095556 A1 | 3/2023 | Komatsu et al. | |
| 2023/0231541 A1 | 7/2023 | Komatsu et al. | |
| 2023/0324502 A1* | 10/2023 | Li | G01S 5/0205 455/456.1 |

* cited by examiner

TUNING MULTIPLEXER FILTERS

CROSS-REFERENCE TO RELATED APPLICATION(S)

This application claims the benefit of U.S. Provisional Application No. 63/266,238, filed Dec. 30, 2021, which is hereby incorporated by reference in its entirety.

BACKGROUND

Field

Embodiments of this disclosure relate to multiplexers that include filters.

Description of the Related Technology

With 5G development, carrier aggregation (CA) is being implemented in radio frequency (RF) modules. To support carrier aggregation, multiple filters are ganged together within a multiplexer. When ganged together, filters can experience insertion loss due to loading from one or more of the other filters within the multiplexer. It is also generally desirable to limit the out of band (OOB) impedance of each filter since these bands may overlap with in band frequencies of the other filters in the multiplexer. Achieving low insertion loss for the filters while reducing out of band impedance that affects other filters within the multiplexer can be challenging.

SUMMARY

The innovations described in the claims each have several aspects, no single one of which is solely responsible for its desirable attributes. Without limiting the scope of the claims, some prominent features of this disclosure will now be briefly described.

One aspect of this disclosure is a multiplexer for filtering radio frequency signals, the multiplexer comprising: a first filter coupled to a common node, the first filter configured to pass a first band; a second filter coupled to the common node, the second filter configured to pass a second band; and at least one electrical component configured to generate a notch at a frequency between the first band and the second band.

In some embodiments, the at least one electrical component includes a notch filter.

In some embodiments, the notch filter is coupled to the common node in parallel to the first and second filters.

In some embodiments, the notch filter is coupled to the common node in series with one of the first and second filters.

In some embodiments, the multiplexer further comprises a switch configured to connect the at least one electrical component to the common node.

In some embodiments, the at least one electrical component includes a resonator configured to generate the notch.

In some embodiments, the resonator includes at least one of the following: a cavity resonator, or an acoustic resonator.

In some embodiments, the at least one electrical component includes an inductor (L) and a capacitor (C) configured to generate the notch.

In some embodiments, the inductor and the capacitor are arranged as an LC tank.

In some embodiments, the multiplexer further comprises a third filter coupled to the common node, the third filter configured to pass a third band, wherein the at least one electrical component is further configured to generate a second notch at a second frequency between the second band and the third band.

In some embodiments, the multiplexer further comprises a matching network coupled between the common node and an antenna.

In some embodiments, the first filter is tuned to rotate the first band closer to open impedance as illustrated on a Smith chart.

In some embodiments, the first filter and the second filter both have fixed connections to the common node.

Another aspect is a multiplexer for filtering radio frequency signals, the multiplexer comprising: a first filter coupled to a common node, the first filter configured to pass a first band; a second filter coupled to the common node, the second filter configured to pass a second band; and at least one electrical component configured to generate a notch at a frequency between the first band and the second band, the first filter tuned to lower loading of the first filter.

In some embodiments, the at least one electrical component includes a notch filter.

In some embodiments, the notch filter is coupled to the common node in parallel to the first and second filters.

In some embodiments, the notch filter is coupled to the common node in series with one of the first and second filters.

In some embodiments, the at least one electrical component includes a resonator configured to generate the notch.

In some embodiments, the at least one electrical component includes an inductor (L) and a capacitor (C) configured to generate the notch.

Yet another aspect is a radio frequency module comprising: a multiplexer including a first filter coupled to a common node, the first filter configured to pass a first band, a second filter coupled to the common node, the second filter configured to pass a second band, and at least one electrical component configured to generate a notch at a frequency between the first band and the second band; and an antenna coupled to the multiplexer, the multiplexer and the antenna being enclosed within a common package.

DETAILED DESCRIPTION

Figure 1:
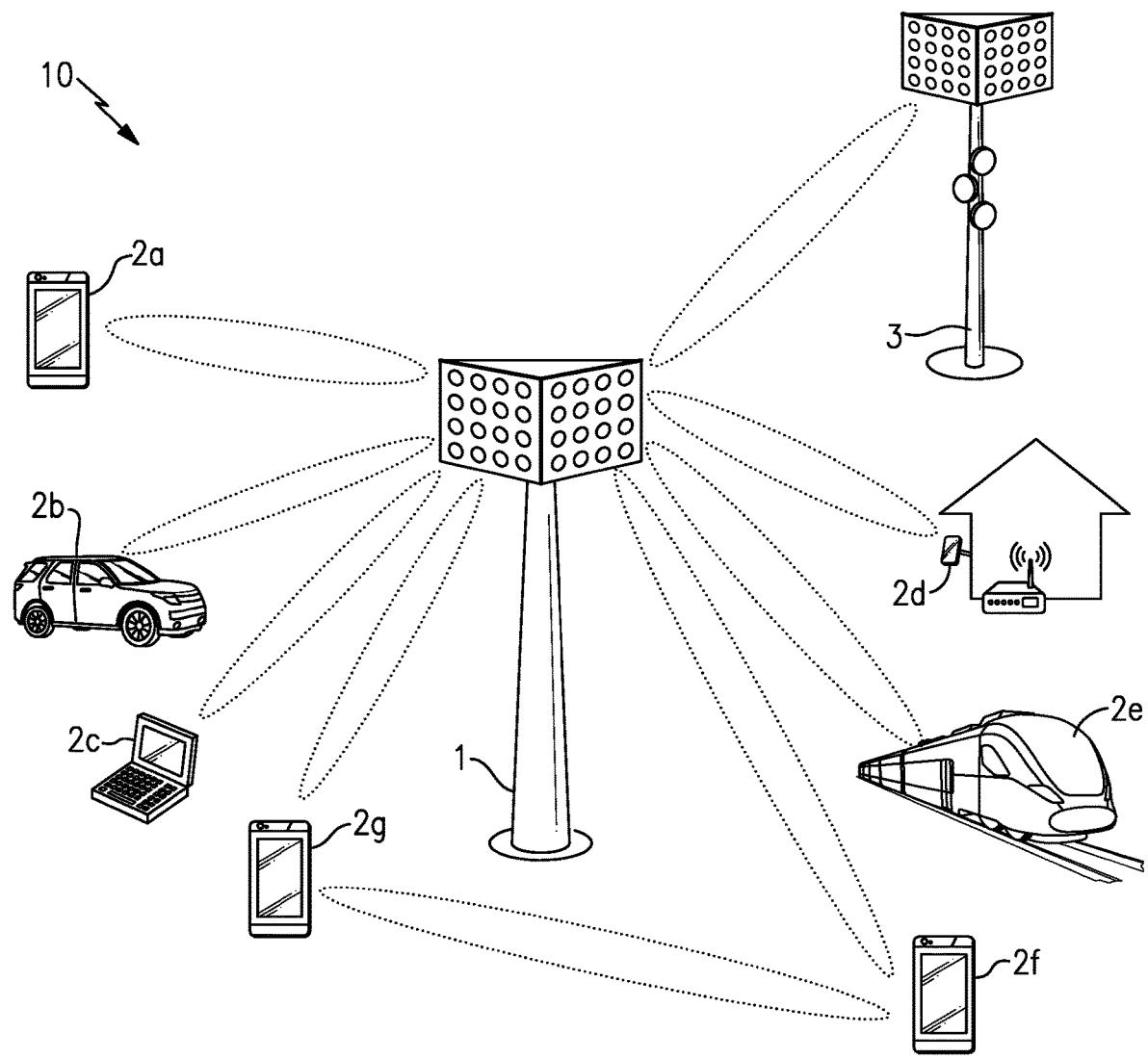
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

With 5G development, carrier aggregation (CA) is increasingly being implemented and/or required for RF modules. To support carrier aggregation, multiple filters are typically ganged together at an input (e.g., within a multiplexer). Therefore, the ganged together filters will be loaded to each other, which can result in a degradation of insertion loss.

With a multiplexer having multiple ganged filters, the input impedance of the multiplexer at each carrier aggregation band frequency range is designed to be matched at the antenna. In addition, for each of the carrier aggregation bands, the input impedance value in the multiplexer is a combination of the filter input impedance itself and the out of band (OOB) impedance of the other carrier aggregation bands. Therefore, in addition to the in-band impedance, the out of band impedance is another design consideration in the implementation of a multiplexer. Additionally, the out of band gamma phase of a multiplexer (before connected to a given filter) at the frequency of the given filter will impact the loading of the multiplexer to the given filter. When the gamma phase of a multiplexer at the frequency range of a given filter moves closer to open (e.g., as illustrated on a Smith chart), the loading of the given filter is lowered.

Depending on the combination of carrier aggregation bands included in a multiplexer, it can be difficult to move the out of band gamma phase to the desired location for a given filter without impacting other bands/filters in the multiplexer.

Aspects of this disclosure relate to systems and techniques for addressing the above-indicated problems, thereby reducing loading of a given filter while reducing or minimizing the out of band gamma phase loading of other filters in the multiplexer. For example, in certain aspect, the out of band gamma phase can be "reset" by creating notch between carrier aggregation band frequency ranges. Advantageously, by implementing such a notch, the out of band gamma phase can be controlled for a specific band, without impacting on the multiplexer gamma phase on other carrier aggregation bands.

Matching components can also be used to rotate the out of band gamma phase closer to open impedance so as to reduce loading to carrier aggregation bands.

In other solutions to this problem, the rotation of out of band gamma phase will typically negatively impact other carrier aggregation bands, which may have already been designed to reduce loading. When rotating the out of band gamma phase, it is sometimes difficult to have the out of band gamma phase at the desired location for other carrier aggregation bands.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

Example Communication Networks and Wireless Communication Devices

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1) in the range of about 410 MHz to about 7.125 GHz, Frequency Range 2 (FR2) in the range of about 24.250 GHz to about 52.600 GHz, or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
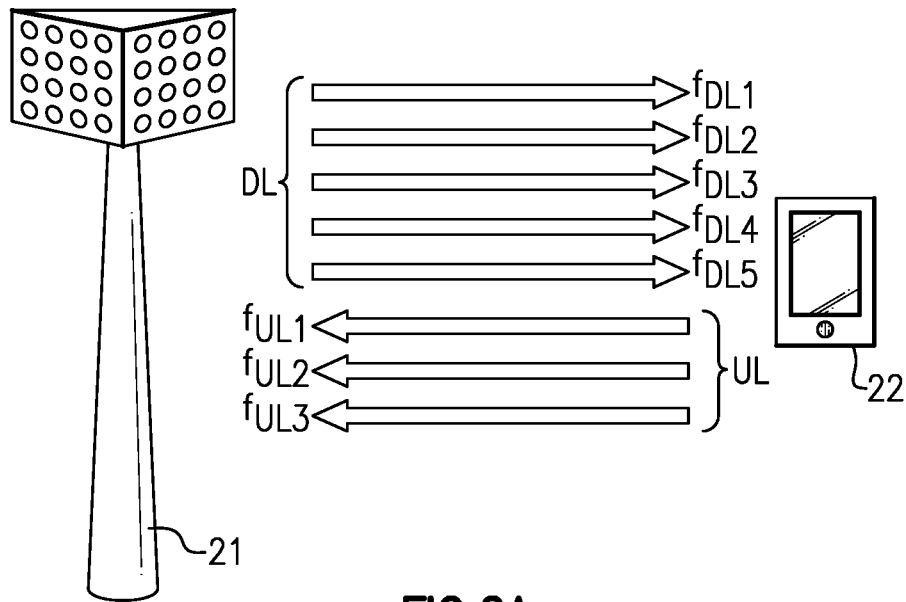
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
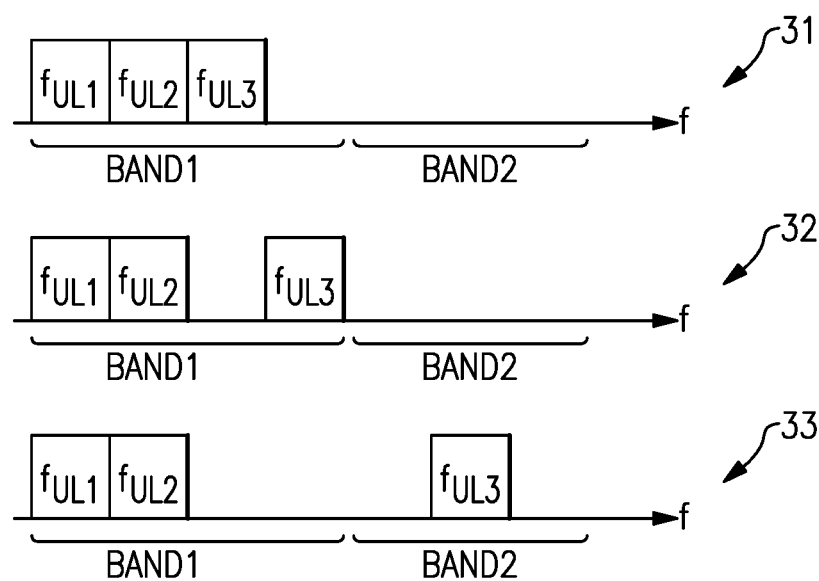
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
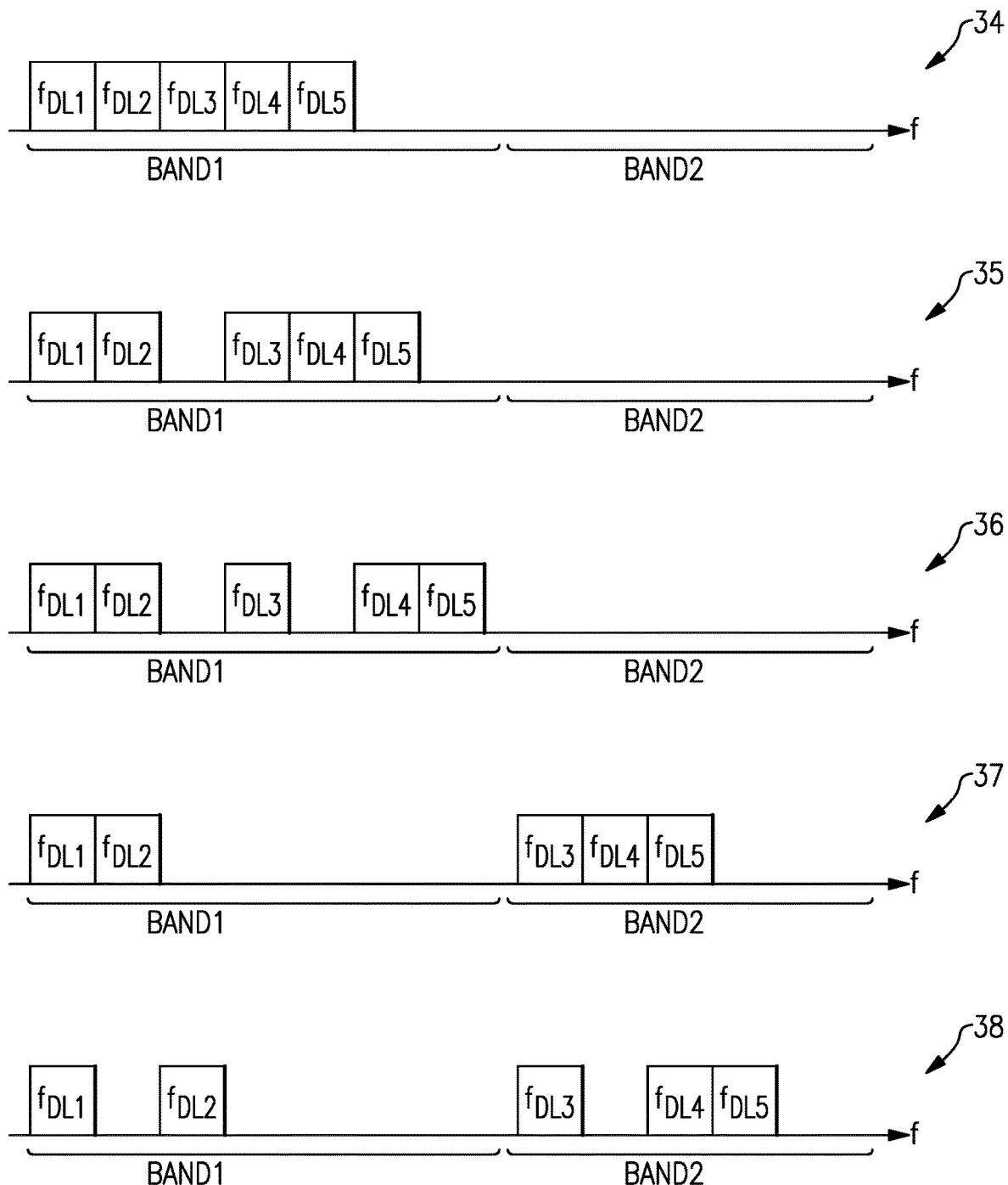
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Figure 3:
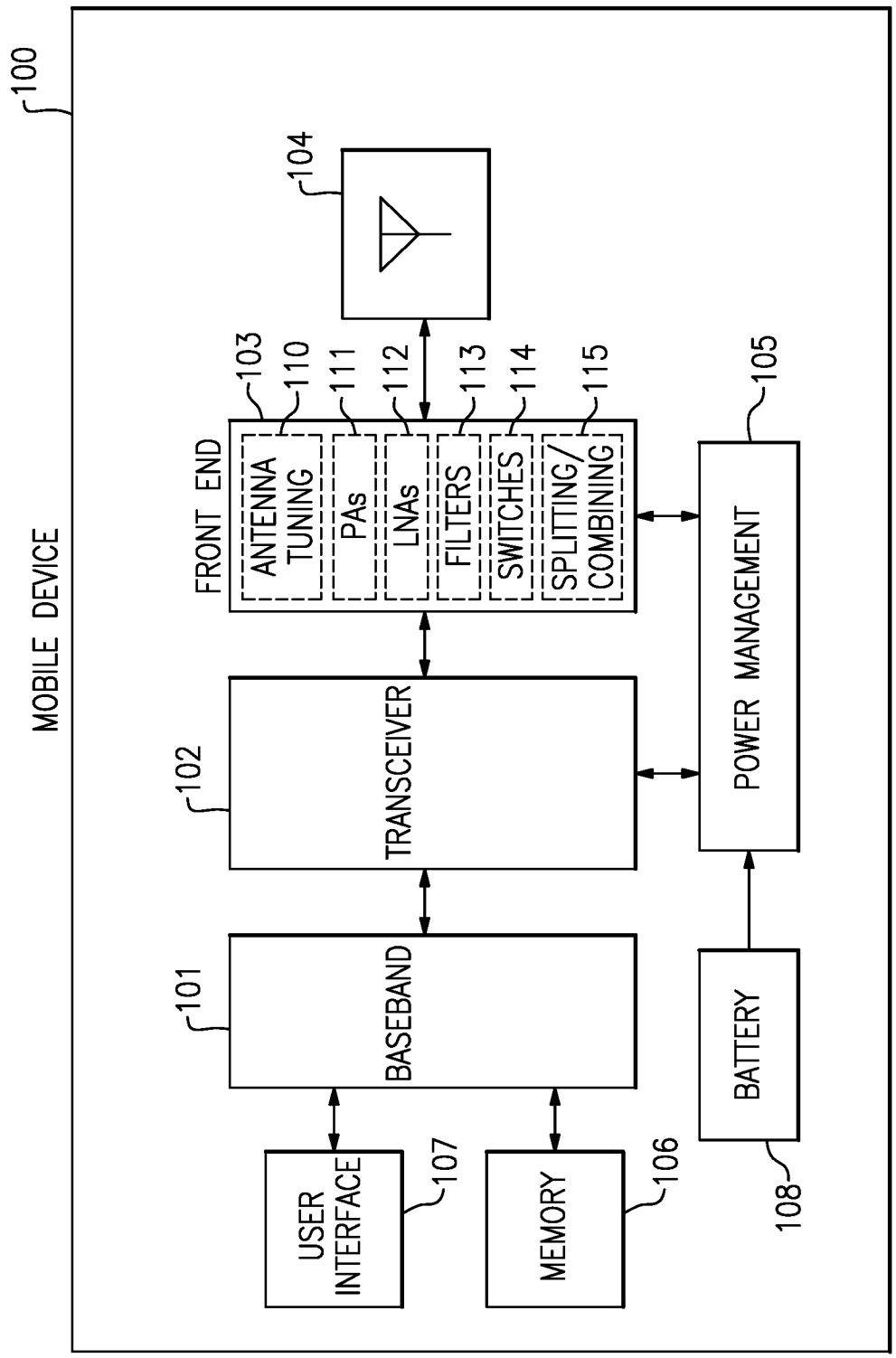
FIG. 3 is a schematic diagram of one embodiment of a mobile device.

FIG. 3 is a schematic diagram of one embodiment of a mobile device 100. The mobile device 100 includes a baseband system 101, a transceiver 102, a front end system 103, antennas 104, a power management system 105, a memory 106, a user interface 107, and a battery 108.

The mobile device 100 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 102 generates RF signals for transmission and processes incoming RF signals received from the antennas 104. It will be understood that various functionalities associated with the transmission and receiving of RF signals can be achieved by one or more components that are collectively represented in FIG. 3 as the transceiver 102. In one example, separate components (for instance, separate circuits or dies) can be provided for handling certain types of RF signals.

The front end system 103 aids in conditioning signals transmitted to and/or received from the antennas 104. In the illustrated embodiment, the front end system 103 includes antenna tuning circuitry 110, power amplifiers (PAs) 111, low noise amplifiers (LNAs) 112, filters 113, switches 114, and signal splitting/combining circuitry 115. However, other implementations are possible.

For example, the front end system 103 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 104 can include antennas used for a wide variety of types of communications. For example, the antennas 104 can include antennas for transmitting and/or receiving signals associated with a wide variety of frequencies and communications standards.

In certain implementations, the antennas 104 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 100 can operate with beamforming in certain implementations. For example, the front end system 103 can include amplifiers having controllable gain and phase shifters having controllable phase to provide beam formation and directivity for transmission and/or reception of signals using the antennas 104. For example, in the context of signal transmission, the amplitude and phases of the transmit signals provided to the antennas 104 are controlled such that radiated signals from the antennas 104 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 104 from a particular direction. In certain implementations, the antennas 104 include one or more arrays of antenna elements to enhance beamforming.

The baseband system 101 is coupled to the user interface 107 to facilitate processing of various user input and output (I/O), such as voice and data. The baseband system 101 provides the transceiver 102 with digital representations of transmit signals, which the transceiver 102 processes to generate RF signals for transmission. The baseband system 101 also processes digital representations of received signals provided by the transceiver 102. As shown in FIG. 3, the baseband system 101 is coupled to the memory 106 of facilitate operation of the mobile device 100.

The memory 106 can be used for a wide variety of purposes, such as storing data and/or instructions to facilitate the operation of the mobile device 100 and/or to provide storage of user information.

The power management system 105 provides a number of power management functions of the mobile device 100. In certain implementations, the power management system 105 includes a PA supply control circuit that controls the supply voltages of the power amplifiers 111. For example, the power management system 105 can be configured to change the supply voltage(s) provided to one or more of the power amplifiers 111 to improve efficiency, such as power added efficiency (PAE).

As shown in FIG. 3, the power management system 105 receives a battery voltage from the battery 108. The battery 108 can be any suitable battery for use in the mobile device 100, including, for example, a lithium-ion battery.

Out of Band Tuning for Multiplexers with Filters for Carrier Aggregation

Figure 4:
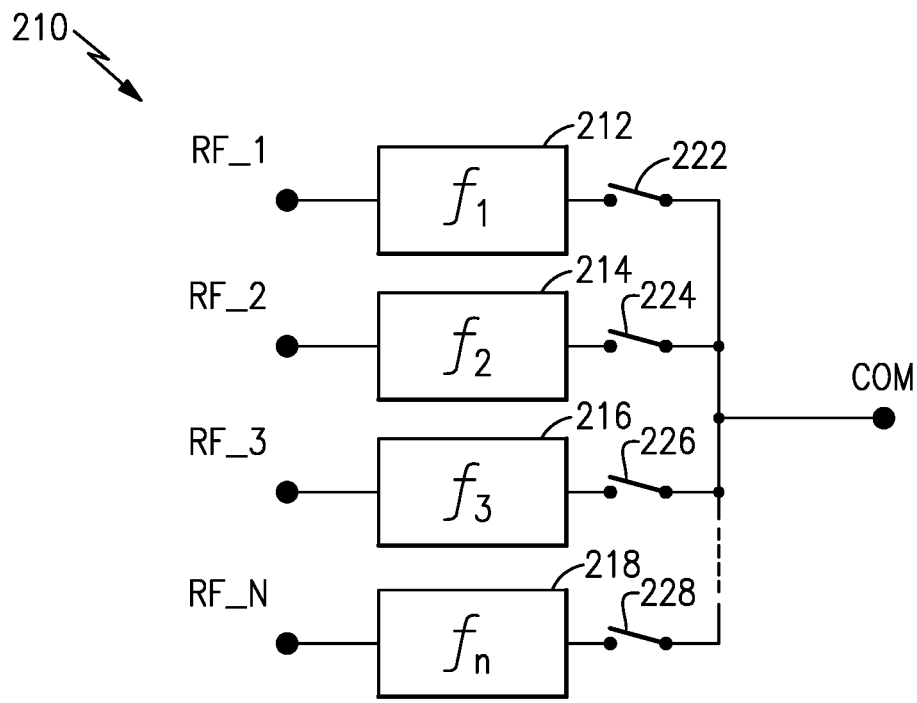
FIG. 4 is a schematic diagram of a multiplexer.

FIG. 4 is a schematic diagram of a multiplexer 210. The multiplexer 210 includes a plurality of filters coupled to a common node COM. As illustrated, the multiplexer 210 includes a filter 212 with a passband $f_1$, a filter 214 with a passband $f_2$, a filter 216 with a passband $f_3$, a filter 218 with a passband $f_N$ coupled to each other at the common node COM by respective switches 222, 224, 226, and 228. Each of the filters 212, 214, 216, and 218 can be a band pass filter with a different passband. In some embodiments, the filters 212, 214, 216, and 218 can include acoustic resonators, however, other implementations of the filters 212, 214, 216, and 218 are possible and the filters 212, 214, 216, and 218 are not limited to an acoustic resonator implementation.

FIG. 4 illustrates four filters in the multiplexer 210 for illustrative purposes, although any suitable number of filters can be included in any of the multiplexers disclosed herein. The switches 222, 224, 226, and 228 can selectively electrically connect respective filters 212, 214, 216, and 218 to the common node COM. This can electrically connect any suitable combination of the filters 212, 214, 216, and 218 to the common node COM at a given time. The multiplexer 210 can support various carrier aggregations.

The multiplexer 210 implements switched multiplexing. In switched multiplexing, a filter is coupled to a common node via a switch. Switched multiplexing can present different technical challenges than fixed multiplexing. Filters have fixed electrical connections to the common node in fixed multiplexing applications. Fixed multiplexing can be referred to as hard multiplexing.

In fixed multiplexing, the impedance at the common node is typically not open for one filter at a frequency in passband of another filter. Impedance matching and design optimization for filters with fixed connections to a common node of the multiplexer can be implemented in fixed multiplexing applications.

In certain applications, the filters 212, 214, 216, and 218 can all be receive filters. Such applications can include diversity receive applications. When the illustrated filters are each receive filters, input/output ports RF_1, RF_2, RF_3, and RF_N can be output ports and the common node COM can serve as an input port. According to some other applications, the filters 212, 214, 216, and 218 can all be transmit filters. When the illustrated filters are each transmit filters, the input/output ports RF_1, RF_2, RF_3, and RF_N can be input ports and the common node COM can serve as an output port. The filters 212, 214, 216, and 218 can include any suitable combination of one or more transmit filters and/or one or more receive filters.

The multiplexer 210 can be implemented in carrier aggregation applications. In certain carrier aggregation specifications, phases for carrier aggregation bands for gamma of one filter are specified to be relatively close to open impedance and/or phase spreading is specified to be relatively small.

Figure 5:
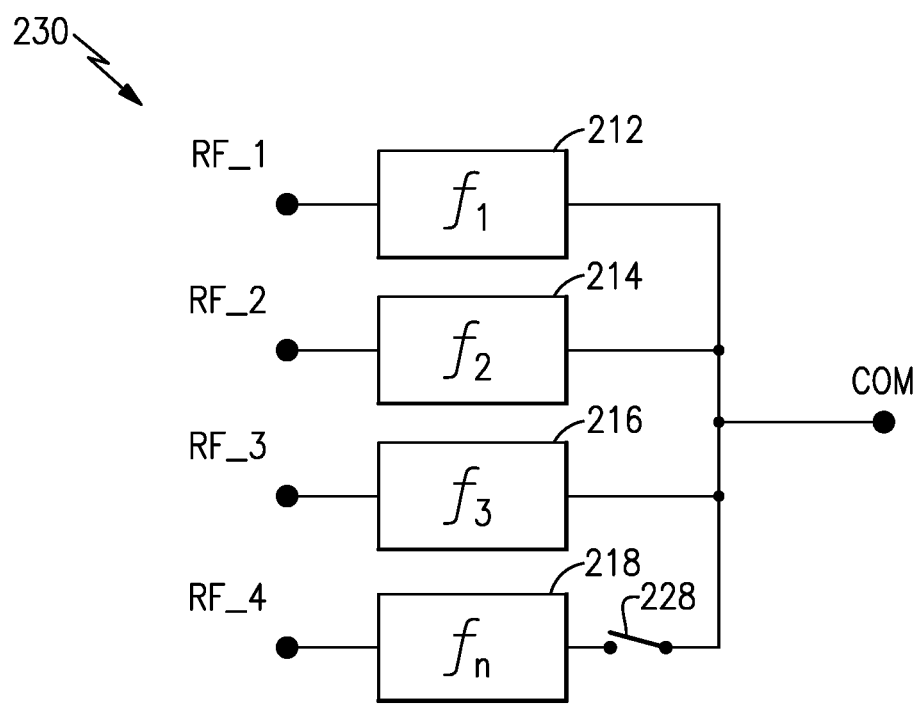
FIG. 5 is a schematic diagram of a multiplexer.

FIG. 5 is a schematic diagram of a multiplexer 230. The multiplexer 230 includes filters 212, 214, and 216 with fixed connections to a common node COM and a filter 218 coupled to the common node COM via the switch 228. Accordingly, the multiplexer 230 implements a combination of fixed multiplexing and switched multiplexing. Each of the filters 212, 214, 216, and 218 can be a band pass filter with a different passband. In the multiplexer 230, the filter 218 can have the highest passband of all filters of the multiplexer 230 (i.e., $f_N$>each of $f_1$, $f_2$, $f_3$) in certain applications.

Although FIG. 4 illustrates an example multiplexer 210 implementing switched multiplexing and FIG. 5 illustrates an example multiplexer 210 implementing mixed multiplexing, aspects of this disclosure may relate to multiplexers having switched, fixed, and/or mixed multiplexing.

As mentioned above, carrier aggregation is an important aspect of 5G technology, which is increasingly being implemented in RF modules. To support carrier aggregation, a multiplexer can be provided with a plurality of filters which are ganged together at the input (e.g., coupled to the antenna). When filters are ganged together in this way, the filters will be loaded to each other, which typically results in a degradation of insertion loss.

For a multiplexer case, it is desirable to match the input impedance of the multiplexer at each carrier aggregation band frequency range needs at the antenna. In addition, for each of the carrier aggregation bands, the input impedance value in multiplexer is a combination of the filter input impedance itself and the out of band impedance of other carrier aggregation bands. In other words, the out of band impedance for one carrier aggregation band may be in-band for another carrier aggregation band. Therefore, not only the in-band impedance, but also the out of band impedance is an important design characteristic for multiplexers used for carrier aggregation.

Additionally, the out of band gamma phase of a multiplexer (before connected to, e.g., filter A) at the frequency range of filter A will impact the loading of other filters in the multiplexer to filter A and vice versa. When the gamma phase of the multiplexer at the frequency range of filter A is close to open impedance, the loading is reduced.

Depending on combination of bands used for carrier aggregation, it can be difficult to move the out of band gamma phase to a desired location without impacting other bands. Thus, aspects of this disclosure relate to techniques for tuning out of band gamma phase while reducing the impact of such tuning on other bands within the multiplexer.

Figure 6:
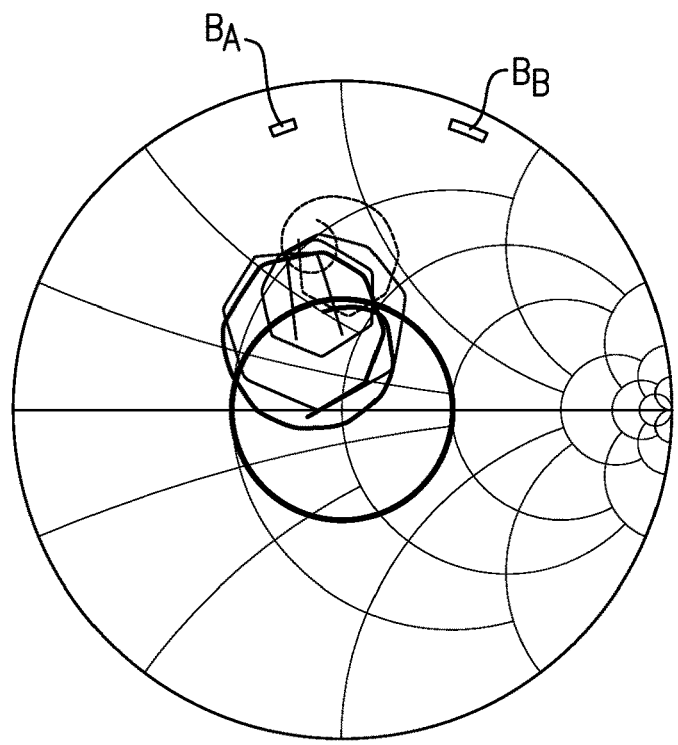
FIG. 6 is a Smith chart for a multiplexer with a first band and a second band in accordance with aspects of this disclosure.
Figure 7:
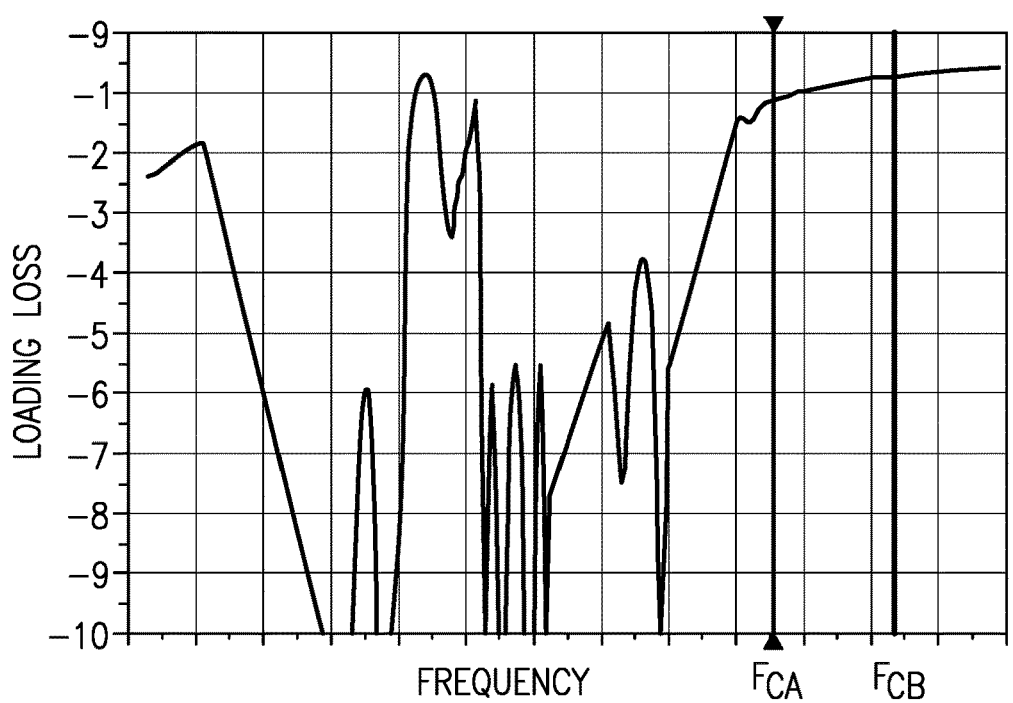
FIG. 7 is a graph illustrating the loading loss against frequency for the first band in accordance with aspects of this disclosure.

FIG. 6 is a Smith chart for a multiplexer with a first band $B_A$ and a second band $B_B$ in accordance with aspects of this disclosure. The multiplexer may include a first filter A and a second filter B, respectively configured to pass frequencies corresponding to the first band $B_A$ and the second band $B_B$. FIG. 7 is a graph illustrating the loading loss against frequency for the first band $B_A$ in accordance with aspects of this disclosure. Also shown in FIG. 7 are the center frequency $F_{CA}$ of the first band $B_A$ and the center frequency $F_{CB}$ of the second band $B_B$.

The loading loss of the multiplexer having the first and second bands $B_A$ and $B_B$ is a function of the gamma magnitude and phase. For example, loading loss can be calculated according to the following equation:

Loading loss=dB(mag(2*(1+S11)/(3+S11)))

The loading loss for the multiplexer at the first band $B_A$ may be higher when the first band $B_A$ is connected to the second band $B_B$. In addition, the multiplexer out of band gamma phase for the second band $B_B$ is generally tuned/optimized before being connected to the first band $B_A$. Thus, it is desirable to reduce or minimize any changes to the gamma phase of the second band $B_B$ when tuning the gamma phase of the first band $B_A$.

Figure 8:
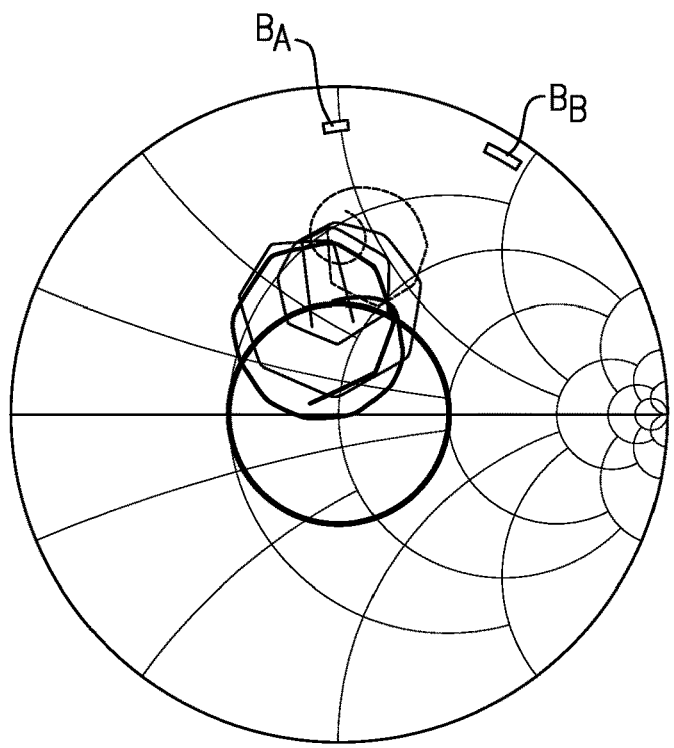
FIG. 8 is a Smith chart for a multiplexer with the first band of the first filter that has been tuned in accordance with aspects of this disclosure.
Figure 9:
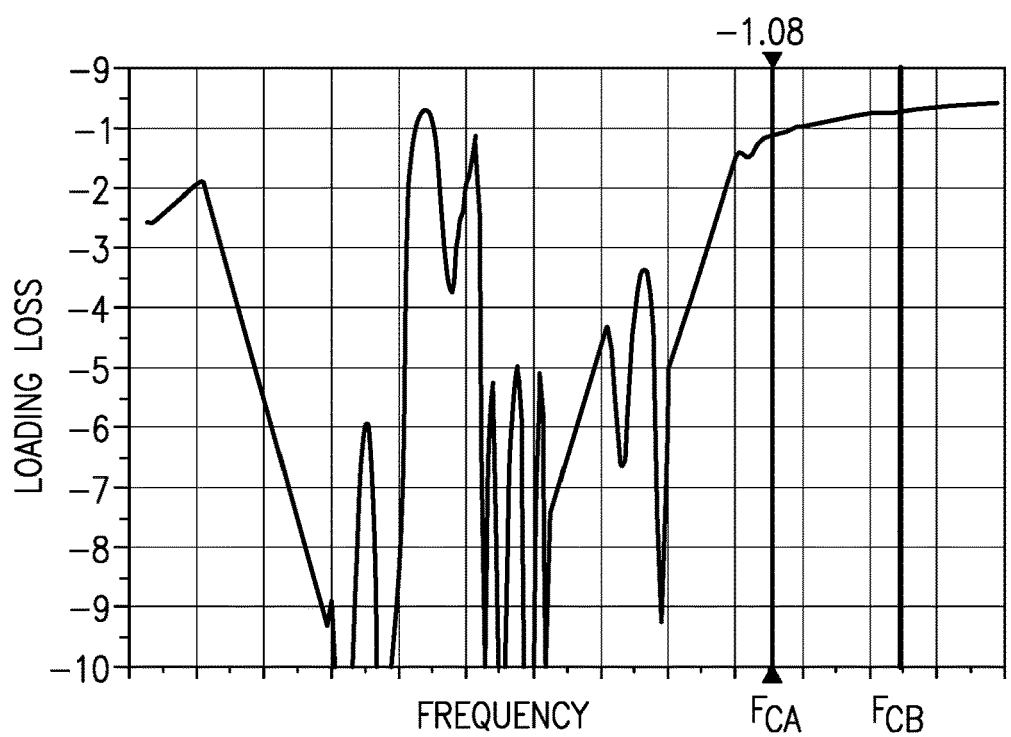
FIG. 9 is a graph illustrating the loading loss against frequency for the tuned first filter in accordance with aspects of this disclosure.

FIG. 8 is a Smith chart for a multiplexer with the first band $B_A$ of the first filter A that has been tuned in accordance with aspects of this disclosure. FIG. 9 is a graph illustrating the loading loss against frequency for the tuned first filter A in accordance with aspects of this disclosure.

One technique for tuning the first band $B_A$ is to use matching components in the first filter A to rotate the phase at the first filter A. As shown in FIG. 8, the rotation of the first band $B_A$ can produce lower loading for the first band $B_A$. However, the amount of rotation that can be applied to the first band $B_A$ is limited since changing the phase of the first band $B_A$ also results in moving the out of band phase for the second band $B_B$. Because the out of band phase for the second band $B_B$ has already been tuned/optimized, it is undesirable to move the out of band phase for band $B_B$ from its currently tuned location.

Thus, there can be significant limitations to the use of matching components alone to rotate the out of band gamma phase to close to open impedance in order to reduce loading to carrier aggregation bands. In other words, the rotation of out of band gamma phase can impact other carrier aggregation bands since the filters are ganged together in the multiplexer. When rotating the out of band gamma phase, it can be difficult to have the out of band gamma phase at a location that does not negatively affect the other carrier aggregation bands.

Accordingly, aspects of this disclosure relate to techniques for resetting the out of band gamma phase by creating notch in between bands. Using this technique, the out of band gamma phase can be controlled for a specific band, with little to no impact on the gamma phase of other carrier aggregation bands within the multiplexer.

Figure 10:
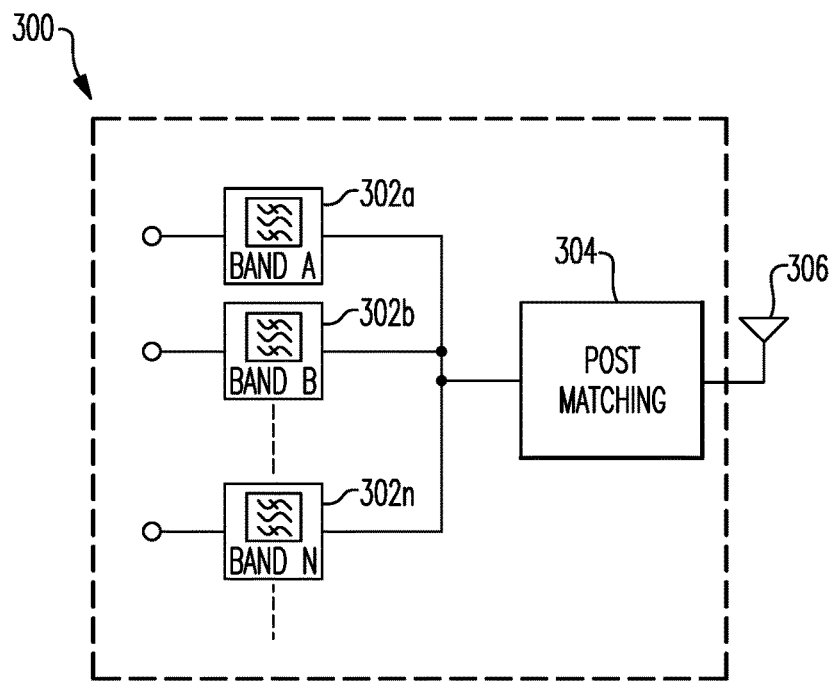
FIG. 10 illustrates an embodiment of a multiplexer configured to carrier aggregation without the use of a notch.

FIG. 10 illustrates an embodiment of a multiplexer 300 configured to carrier aggregation without the use of a notch. The multiplexer 300 includes a plurality filters 302a, 302b, ... 302n and post matching circuitry 304. The filters 302a, 302b, ... 302n are connected to a common node prior to being connect to the post matching circuitry 304. The multiplexer 300 is connected to an antenna 306. Each of the filters 302a-302n may be configured to pass frequencies for a corresponding one of the bands (e.g., Band A through Band N).

Figure 11:
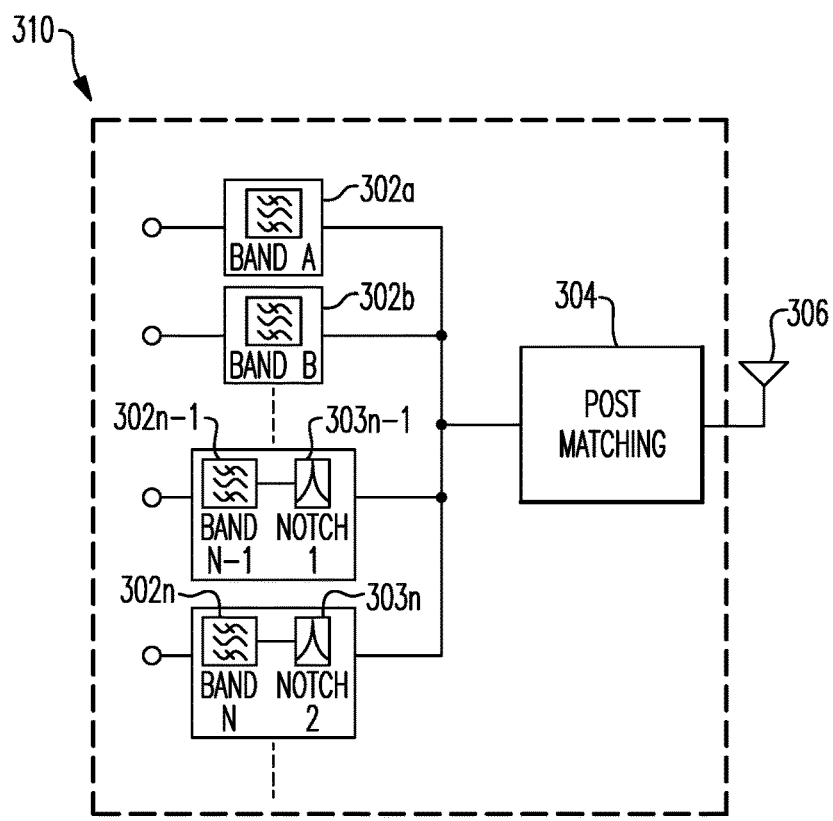
FIG. 11 illustrates an embodiment of a multiplexer configured for carrier aggregation with the use of one or more notches to improve loading loss in accordance with aspects of this disclosure.

FIG. 11 illustrates an embodiment of a multiplexer 310 configured for carrier aggregation with the use of one or more notches to improve loading loss in accordance with aspects of this disclosure. The multiplexer 310 includes a plurality filters 302a, 302b, ..., 302n-1, and 302n and post matching circuitry 304. The filters 302a, 302b, ... 302n are connected to a common node prior to being connect to the post matching circuitry 304. The multiplexer 300 is connected to an antenna 306. Each of the filters 302a-302n may be configured to pass frequencies for a corresponding one of the bands (e.g., Band A through Band N).

The multiplexor 310 of FIG. 11 further includes a first notch filter 303n-1 and a second notch filter 303n, which are respectively collocated with (e.g., located within the same filter package as) the n-1$^{th}$ filter 302n-1 and the n$^{th}$ filter 302n. In some embodiments, the first notch filter 303n-1 may be arranged in series with the n-1$^{th}$ filter 302n-1 and the second notch filter 303n may be arranged in series with the n$^{th}$ filter 302n. While the first notch filter 303n-1 and the second notch filter 303n may be respectively collocated in the same filter package as the n-1$^{th}$ filter 302n-1 and the n$^{th}$ filter 302n in some embodiments, aspects of this disclosure are not limited thereto. For example, in certain implementations one or more of the first notch filter 303n-1 and the second notch filter 303n may be located in a separate package from the n-1$^{th}$ filter 302n-1 and the n$^{th}$ filter 302n. Other arrangements may also be possible.

As is described in further detail in connection with FIGS. 14 and 15, the first and second notch filters 303n-1 and 303n can generate notches located between the frequencies associated with two adjacent bands in order to tune the gamma phase of the corresponding band with little to no impact on the gamma phase of the adjacent band.

Figure 12:
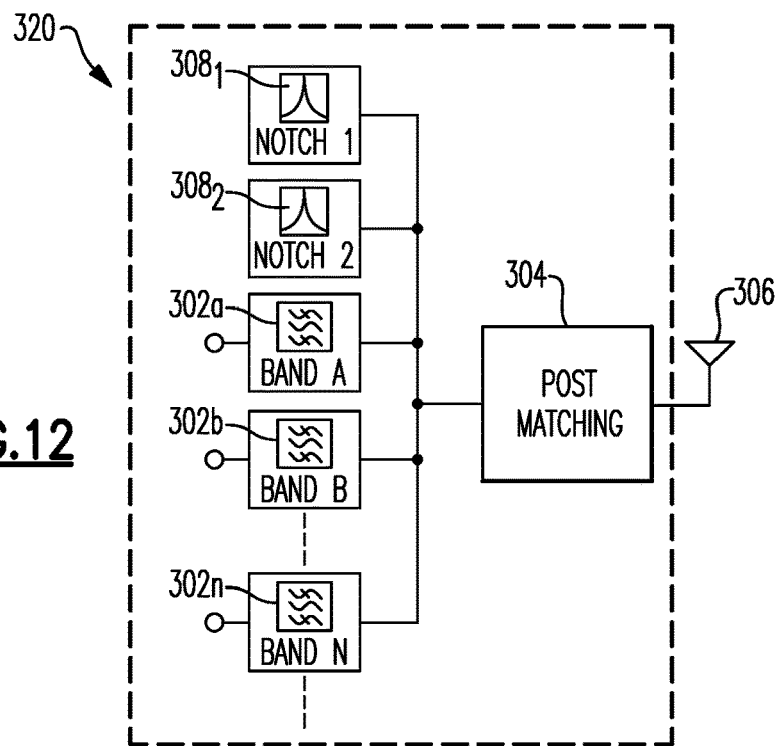
FIG. 12 illustrates another embodiment of a multiplexer configured for carrier aggregation with the use of one or more notches to improve loading loss in accordance with aspects of this disclosure.

FIG. 12 illustrates another embodiment of a multiplexer 320 configured for carrier aggregation with the use of one or more notches to improve loading loss in accordance with aspects of this disclosure. The multiplexer 310 includes a plurality filters 302a, 302b, ..., 302n-1, and 302n, a first notch filter $308_1$, a second notch filter $308_2$, and post matching circuitry 304. The multiplexer 300 is connected to an antenna 306. Each of the filters 302a-302n may be configured to pass frequencies for a corresponding one of the bands (e.g., Band A through Band N).

In the embodiment of FIG. 12, the first notch filter $308_1$ and the second notch filter $308_2$ may be located in individual filter packages separate from the other filters 302a-302n. The first notch filter $308_1$ and the second notch filter $308_2$ are configured to introduce notches located between the frequencies associated with two adjacent bands in order to tune the gamma phase of one of the bands with little to no impact on the gamma phase of the adjacent band. Depending on the implementation, the first notch filter $308_1$ and the second notch filter $308_2$ may be collocated in the same filter package separate from the other filters 302a-302n or may be collocated in the same filter package with the other filters 302a-302n. Other arrangements may also be possible.

Figure 13:
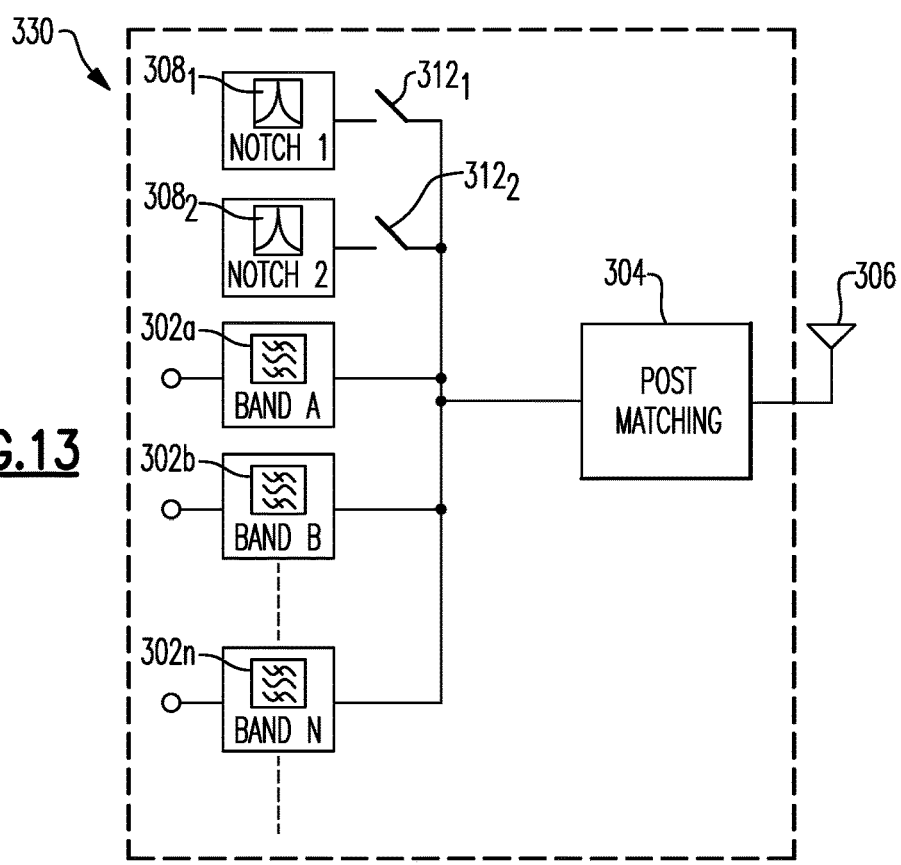
FIG. 13 illustrates yet another embodiment of a multiplexer configured for carrier aggregation with the use of one or more notches to improve loading loss in accordance with aspects of this disclosure.

FIG. 13 illustrates yet another embodiment of a multiplexer 330 configured for carrier aggregation with the use of one or more notches to improve loading loss in accordance with aspects of this disclosure. The multiplexer 330 may be similar to the multiplexer 320 illustrated in FIG. 12 with the inclusion of a first switch $312_1$ and a second switch $312_2$, respectively configured to connect the first notch filter $308_1$ and the second notch filter $308_2$ to the filters 302a-302n (e.g., via the common node). Accordingly, one or more of the first and second notch filters $308_1$ and $308_2$ can be disconnected form the filters 302a-302n in the event that tuning is not required. Depending on the implementation, the first notch filter $308_1$ and the second notch filter $308_2$ may be collocated in the same filter package separate from the other filters 302a-302n or may be collocated in the same filter package with the other filters 302a-302n. Other arrangements may also be possible.

Figure 14:
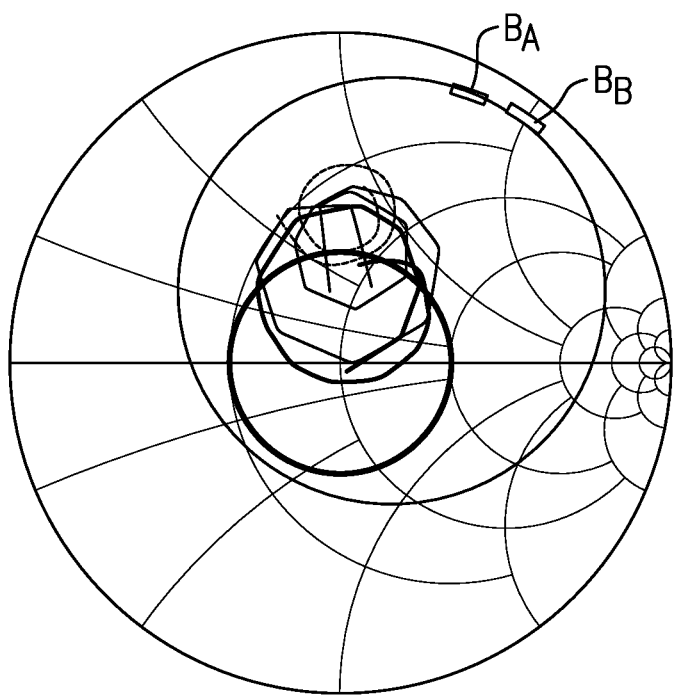
FIG. 14 is a Smith chart for a multiplexer with the first band of the first filter that has been tuned in accordance with aspects of this disclosure.

FIG. 14 is a Smith chart for a multiplexer with the first band $B_A$ of the first filter A that has been tuned in accordance with aspects of this disclosure. FIG. 15 is a graph illustrating the loading loss against frequency for the tuned first filter A in accordance with aspects of this disclosure.

Figure 15:
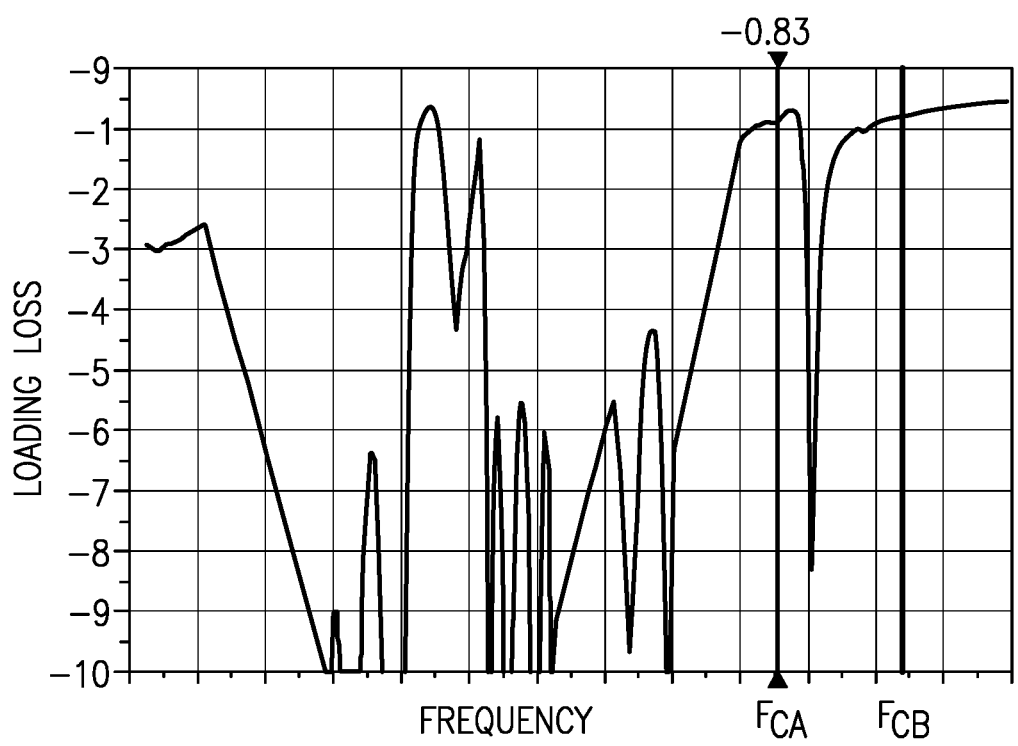
FIG. 15 is a graph illustrating the loading loss against frequency for the tuned first filter in accordance with aspects of this disclosure.

With reference to FIGS. 14 and 15, a notch is introduced between the first band $B_A$ and the second band $B_B$. By providing the notch between the first band $B_A$ and the second band $B_B$, the tuned multiplexor is able to move (e.g., as a rotation on the Smith chart) the first band $B_A$ and the second band $B_B$ closer to open circuit as shown in FIG. 14. The notch also enables the tuning of the first band $B_A$ without significantly affecting the tuning of the second band $B_B$. The notch can be implemented in a variety of different ways, including, for example, using one or more electrical components. In some implementations, the notch may be configured to reset the multiplexer out of band gamma phase location.

Figure 16:
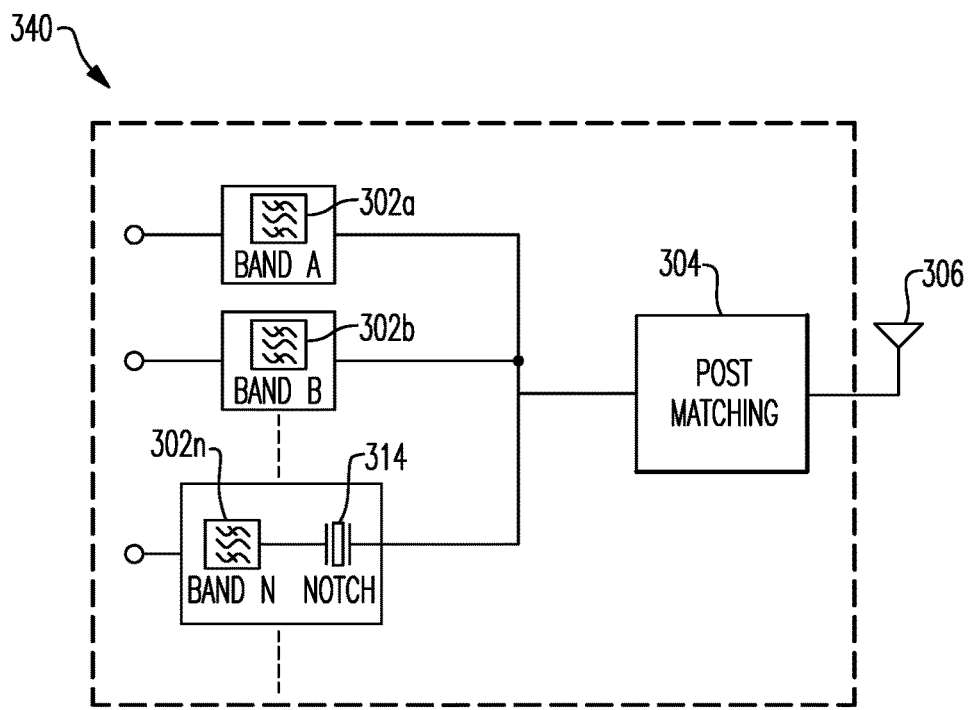
FIG. 16 is a circuit diagram illustrating an embodiment of a multiplexer having a notch in accordance with aspects of this disclosure.

FIG. 16 is a circuit diagram illustrating an embodiment of a multiplexer 340 having a notch in accordance with aspects of this disclosure. With reference to FIG. 16, the multiplexer 340 includes a plurality filters 302a, 302b, . . . 302n and post matching circuitry 304. The filters 302a, 302b, . . . 302n are connected to a common node prior to being connect to the post matching circuitry 304. The multiplexer 360 is connected to an antenna 306. Each of the filters 302a-302n may be configured to pass frequencies for a corresponding one of the bands (e.g., Band A through Band N).

The multiplexer of FIG. 16 may be substantially similar to the multiplexer of FIG. 10 with the addition of a resonator 314 to create the notch. The resonator 314 may be collocated with one of the filters 302a-302n (e.g., filter 302n in the illustrated embodiment). In some embodiments, the resonator 314 may be arranged in series with the corresponding filter 302n. Depending on the implementation, the resonator 314 may be implemented as a cavity resonator, or an acoustic resonator (e.g., a surface acoustic wave (SAW) filter, a bulk acoustic wave (BAW) filter, a Lamb wave filter, etc.).

Figure 17:
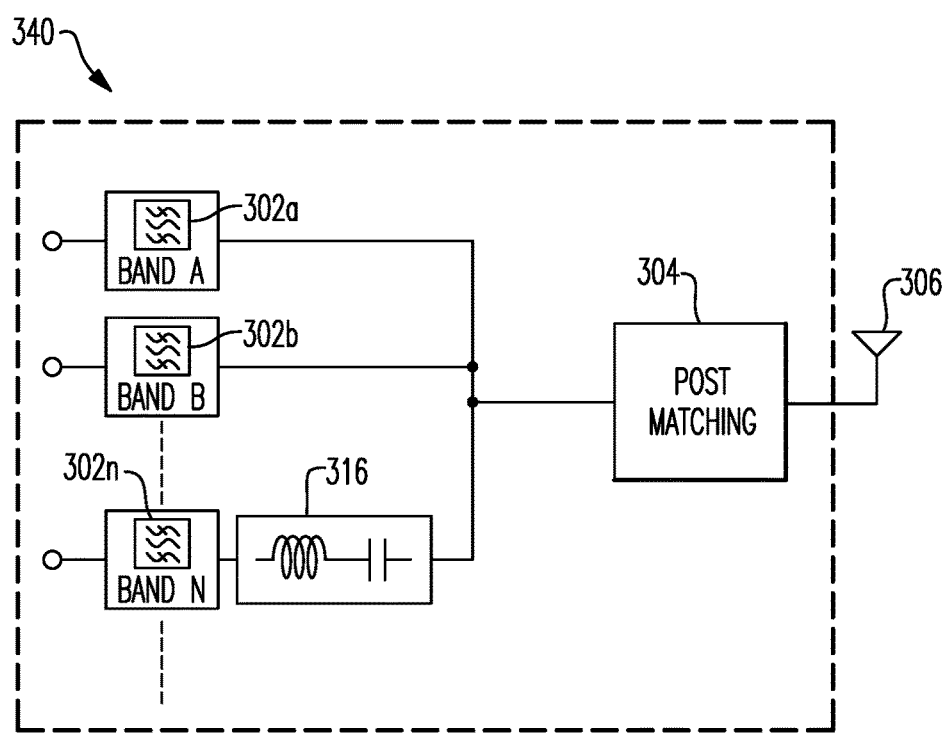
FIG. 17 is a circuit diagram illustrating another embodiment of a multiplexer having a notch in accordance with aspects of this disclosure.

FIG. 17 is a circuit diagram illustrating another embodiment of a multiplexer 340 having a notch in accordance with aspects of this disclosure. With reference to FIG. 17, the multiplexer 340 includes a plurality filters 302a, 302b, . . . 302n and post matching circuitry 304. The filters 302a, 302b, . . . 302n are connected to a common node prior to being connect to the post matching circuitry 304. The multiplexer 360 is connected to an antenna 306. Each of the filters 302a-302n may be configured to pass frequencies for a corresponding one of the bands (e.g., Band A through Band N).

The multiplexer of FIG. 17 may be substantially similar to the multiplexer of FIG. 10 with the addition of one or more inductor and capacitor (LC) elements 316 to create the notch. The LC elements 316 may be collocated with one of the filters 302a-302n (e.g., filter 302n in the illustrated embodiment). In some embodiments, the LC elements 316 may be arranged in series with the corresponding filter 302n. In some embodiments, the LC elements 316 may be arranged as an LC tank.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators described herein may be embodied in a variety of other forms. Furthermore, various omissions, substitutions and changes in the form of the resonators described herein may be made without departing from the spirit of the disclosure. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A multiplexer for filtering radio frequency signals, the multiplexer comprising:
    a first filter coupled to a common node, the first filter configured to pass a first band, the first filter including one or more matching components configured to rotate a phase of the first filter to lower loading for the first band;
    a second filter coupled to the common node, the second filter configured to pass a second band; and
    at least one electrical component configured to generate a notch at a frequency between the first band and the second band, the notch further configured to reduce out of band gamma phase loading resulting from rotating the phase of the first filter from loading the second filter.

2. The multiplexer of claim 1 wherein the at least one electrical component includes a notch filter.

3. The multiplexer of claim 2 wherein the notch filter is coupled to the common node in parallel to the first and second filters.

4. The multiplexer of claim 2 wherein the notch filter is coupled to the common node in series with one of the first and second filters.

5. The multiplexer of claim 1 further comprising a switch configured to connect the at least one electrical component to the common node.

6. The multiplexer of claim 1 wherein the at least one electrical component includes a resonator configured to generate the notch.

7. The multiplexer of claim 6 wherein the resonator includes at least one of the following: a cavity resonator, or an acoustic resonator.

8. The multiplexer of claim 1 wherein the at least one electrical component includes an inductor and a capacitor configured to generate the notch.

9. The multiplexer of claim 8 wherein the inductor and the capacitor are arranged as an inductor-capacitor tank.

10. The multiplexer of claim 1 further comprising a third filter coupled to the common node, the third filter configured to pass a third band, wherein the at least one electrical component is further configured to generate a second notch at a second frequency between the second band and the third band.

11. The multiplexer of claim 1 further comprising a matching network coupled between the common node and an antenna.

12. The multiplexer of claim 1 wherein the rotation of the phase of the first filter moves the first band closer to open impedance as illustrated on a Smith chart.

13. The multiplexer of claim 1 wherein the first filter and the second filter both have fixed connections to the common node.

14. The multiplexer of claim 1 wherein the at least one electrical component is further configured to generate the notch such that the rotation of the phase of the first filter has substantially no effect on loading for the second band.

15. A multiplexer for filtering radio frequency signals, the multiplexer comprising:
  a first filter coupled to a common node, the first filter configured to pass a first band, the first filter tuned to rotate a phase of the first filter to lower loading for the first band;
  a second filter coupled to the common node, the second filter configured to pass a second band; and
  at least one electrical component configured to generate a notch at a frequency between the first band and the second band, the notch further configured to reduce out of band gamma phase loading resulting from rotating the phase of the first filter from loading the second filter.

16. The multiplexer of claim 15 wherein the at least one electrical component includes a notch filter.

17. The multiplexer of claim 16 wherein the notch filter is coupled to the common node in parallel to the first and second filters.

18. The multiplexer of claim 16 wherein the notch filter is coupled to the common node in series with one of the first and second filters.

19. The multiplexer of claim 15 wherein the at least one electrical component includes a resonator configured to generate the notch.

20. The multiplexer of claim 15 wherein the at least one electrical component includes an inductor and a capacitor configured to generate the notch.

21. A radio frequency module comprising:
  a multiplexer including a first filter coupled to a common node, the first filter configured to pass a first band, the first filter including one or more matching components configured to rotate a phase of the first filter to lower loading for the first band, a second filter coupled to the common node, the second filter configured to pass a second band, and at least one electrical component configured to generate a notch at a frequency between the first band and the second band, the notch further configured to reduce out of band gamma phase loading resulting from rotating the phase of the first filter from loading the second filter; and
  an antenna coupled to the multiplexer, the multiplexer and the antenna being enclosed within a common package.

* * * * *